(12) United States Patent
Chen et al.

(10) Patent No.: US 12,724,047 B2
(45) Date of Patent: Sep. 1, 2026

(54) METHOD AND APPARATUS FOR PHASE DETECTION

(71) Applicant: SHENZHEN PANGO MICROSYSTEMS CO., LTD, Shenzhen (CN)

(72) Inventors: Xinjian Chen, Shenzhen (CN); Yuanjun Liang, Shenzhen (CN)

(73) Assignee: SHENZHEN PANGO MICROSYSTEMS CO., LTD, Shenzhen (CN)

( * ) Notice: Subject to any disclaimer, the term of this patent is extended or adjusted under 35 U.S.C. 154(b) by 162 days.

(21) Appl. No.: 18/770,226

(22) Filed: Jul. 11, 2024

(65) Prior Publication Data

US 2024/0361368 A1 Oct. 31, 2024

Related U.S. Application Data

(63) Continuation of application No. PCT/CN2022/091309, filed on May 6, 2022.

(30) Foreign Application Priority Data

Jan. 26, 2022 (CN) ........................ 202210095390.X

(51) Int. Cl.

| | |
|---|---|
| ***G01R 25/00*** | (2006.01) |
| ***H03K 5/26*** | (2006.01) |
| ***H03L 7/085*** | (2006.01) |
| ***H04L 7/00*** | (2006.01) |

(52) U.S. Cl.
CPC ............ *G01R 25/005* (2013.01); *H03K 5/26* (2013.01); *H03L 7/085* (2013.01); *H04L 7/0054* (2013.01)

(58) Field of Classification Search
CPC ...... G01R 25/00; G01R 25/005; G01R 25/02; H03L 7/085; H03K 3/26; H04L 25/03057; H04L 7/0054; H04L 7/0079
See application file for complete search history.

(56) References Cited

U.S. PATENT DOCUMENTS

| | | | | |
|---|---|---|---|---|
| 9,479,364 | B2 * | 10/2016 | He | H04L 7/0079 |
| 11,438,134 | B2 * | 9/2022 | Lu | H04L 7/0331 |
| 2024/0348420 | A1 * | 10/2024 | Teterwak | H04L 7/033 |

* cited by examiner

*Primary Examiner* — Betsy Deppe

(57) ABSTRACT

This application discloses a method and apparatus for phase detection. The method includes: receiving input pulse signals; obtaining the primary sampling points of the input pulse signals; calculating the first area formed by the waveform curve of the input pulse signals and the time axis within the preceding unit time of the primary sampling point; calculating the second area formed by the waveform curve of the input pulse signals and the time axis within the subsequent unit time of the primary sampling point; comparing the size of the first area with the size of the second area to obtain the first comparison result; outputting the phase detection result of the input pulse signals based on the first comparison result and a pre-defined true value rule.

10 Claims, 7 Drawing Sheets

| | The output result of first integration ≥ The output result of second integration | The output result of first integration < The output result of second integration |
|---|---|---|
| e(k) | 1 | 0 |

| | b(k-1) | b(k) | b(k+1) | e(k) |
|---|---|---|---|---|
| early | 0 | 1 | 0 | 1 |
| late | 0 | 1 | 0 | 0 |
| early | 1 | 0 | 1 | 1 |
| late | 1 | 0 | 1 | 0 |

FIG. 8

METHOD AND APPARATUS FOR PHASE DETECTION

CROSS REFERENCE

The present disclosure is a continuation-application of International (PCT) Patent Application No. PCT/CN2022/091309, field on May 6, 2022 which claims priority of Chinese Patent Application No. 202210095390.X field on Jan. 26, 2022 the entire contents of which are hereby incorporated by reference in their entirety.

TECHNICAL FIELD

The present disclosure relates to the technical field of field-programmable gate array technology, especially relates to a method and apparatus for phase detection.

BACKGROUND

In the existing clock data recovery circuit structures, the phase detector obtains lagging or leading information based on the equalized input signal and clock phase. The method used by the existing phase detectors involves directly sampling the input signal to obtain direct sampling data, then comparing the input signal with the reference levels (including high and low levels) to obtain the first sampling output error information and the second sampling output error information. Based on the direct sampling data, the first sampling output error information, the second sampling output error information, and a pre-set method for leading or lagging calculation, the leading or lagging information of the input signal is obtained through calculation.

However, the phase detection method used by conventional techniques in phase detectors does not accurately detect the leading or lagging information of the input signal after detecting the input signal.

SUMMARY

The present disclosure provides a method and apparatus for phase detection.

It solves the technical problem of inaccurate detection of the phase leading or lagging information of the input signal by the phase detector in traditional techniques.

A method for phase detection, comprising:

receiving input pulse signals;

obtaining the primary sampling points of the input pulse signals;

calculating the first area formed by the waveform curve of the input pulse signals and the time axis within the preceding unit time of the primary sampling point;

calculating the second area formed by the waveform curve of the input pulse signals and the time axis within the subsequent unit time of the primary sampling point;

comparing the size of the first area with the size of the second area to obtain the first comparison result;

outputting the phase detection result of the input pulse signals based on the first comparison result and a pre-defined true value rule.

An apparatus for phase detection, comprising:

a first integration circuit, which is configured for receiving the input pulse signals, calculating the first area formed by the waveform curve of the input pulse signals and the time axis within the preceding unit time of the primary sampling point, and sending the first area to a comparator;

a second integration circuit, which is configured for receiving the input pulse signals, calculating the second area formed by the waveform curve of the input pulse signals and the time axis within the subsequent unit time of the primary sampling point, and sending the second area to the comparator;

the comparator, which is configured for receiving the first area and the second area, comparing the size of the first area and the size of the second area to obtain a first comparison result, and sending the first comparison result to an error sampling circuit;

the error sampling circuit, which is configured for receiving the first comparison result, processing the first comparison result to obtain the first error information, and sending the first error information to a phase detection logic circuit;

the data sampling circuit, which is configured for receiving the input pulse signals, processing the input pulse signals to obtain first phase information, and sending the first phase information to the phase detection logic circuit;

the phase detection logic circuit, which is configured for receiving the first error information and the first phase information, performing calculations based on a pre-defined true value rule to obtain the phase detection result of the input pulse signals.

The aforementioned method and apparatus for phase detection, upon receiving the input pulse signals, set the primary sampling points on the phase curve of the input pulse signal. Then, calculating the first area formed by the waveform curve of the input pulse signals and the time axis within the preceding unit time of the primary sampling point, and calculating the second area formed by the waveform curve of the input pulse signals and the time axis within the subsequent unit time of the primary sampling point. Then, comparing the size of the first area with the size of the second area to obtain the first comparison result. Based on the first comparison result and a pre-defined truth value rule, outputting the phase detection result indicating whether the input pulse signals are leading or lagging in phase. The obtained detection result is more accurate, and the sampling of the phase of the input pulse signals is also more accurate based on the detection result.

BRIEF DESCRIPTION OF THE DRAWINGS

FIG. 8 shows a table of the true value rules for the phase detection results in an embodiment of the present invention.

DETAILED DESCRIPTION

Figure 1:
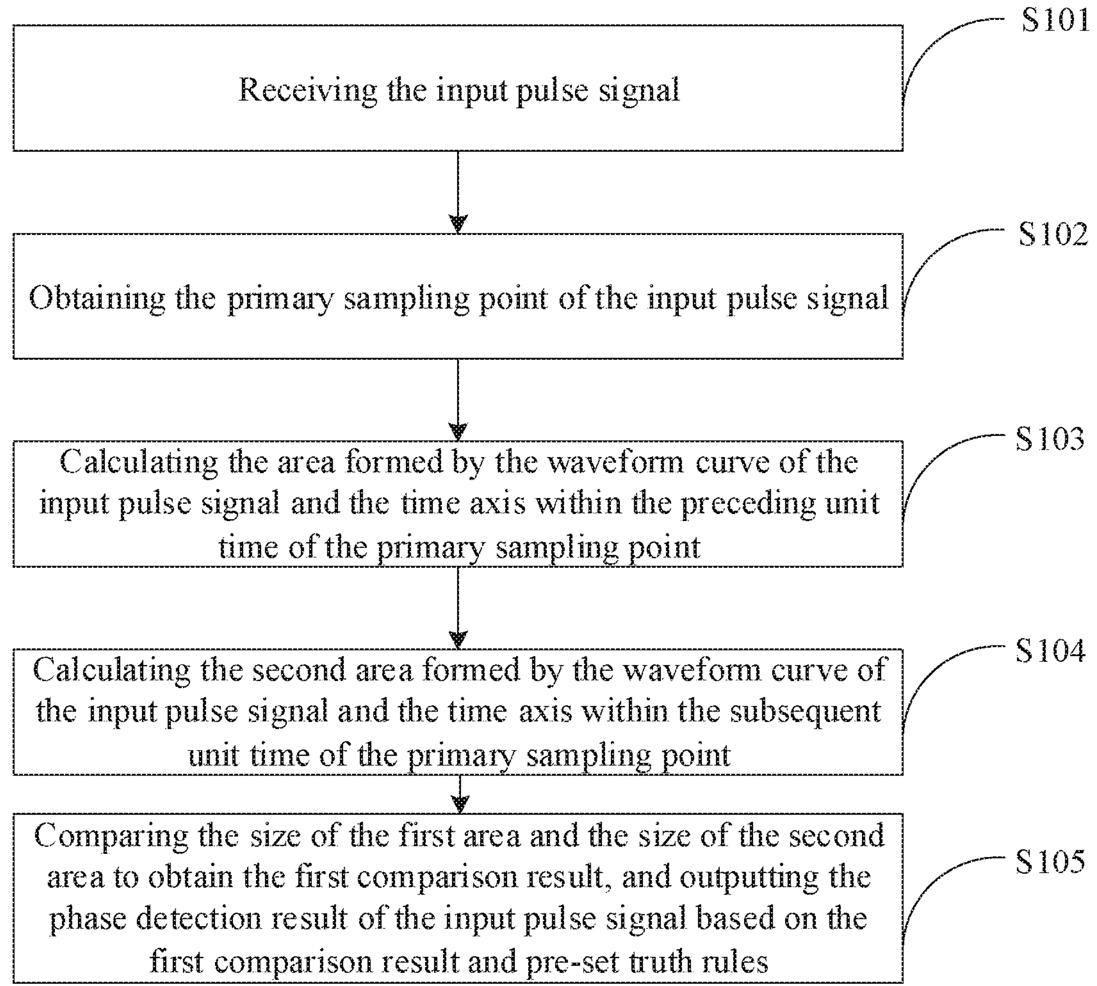
FIG. 1 shows a flowchart of the phase detection method in an embodiment of the present invention.

The present disclosure will be further described below with reference to the accompanying drawings and embodiments.

In the following description, for purposes of explanation and not limitation, specific details are set forth, such as specific system structures, interfaces, techniques, etc., to provide a thorough understanding of the present disclosure.

The terms "system" and "network" are often configured interchangeably. The term "and/or" is only an association relationship to describe associated objects. The term "and/or" indicates that three relationships can exist. For example, A and/or B can mean that A exists alone, A and B exist at the same time, and B exists alone. In addition, the character "/" generally indicates that the related objects are "or". And the "multiple" means two or more.

To facilitate the understanding of the present invention, the technical terms involved in the present invention are listed as follows:

1. CTLE (Continuous Time Linear Equalization), a continuous-time linear equalizer can effectively improve the performance of the received eye diagram in links with high transmission loss.

2. DFE (Decision Feedback Equalization), a decision feedback equalizer can reduce or eliminate the influence of inter-symbol interference (ISI) by canceling the subsequent impacts of the current symbol based on the decision results.

3. CDR (Clock And Data Recovery) a clock data recovery circuit serves two main purposes: first, it provides clock signals to various circuits at the receiver; second, it makes decisions on the received signals, facilitating the recovery and subsequent processing of the data signals.

4. ISI (Inter Symbol Interference), inter-symbol interference is caused by the overall transmission characteristics of the system, which lead to the distortion and broadening of waveform pulses from the preceding and succeeding symbols. This results in long trailing tails from earlier waveforms extending into the sampling moments of the current symbol, thereby interfering with the decision-making process for the current symbol.

5. Symbol, a symbol is the basic signal unit that carries information. In digital communication, symbols of equal time intervals represent a binary digit. The signal within this time interval is called a (binary) symbol.

6. Eye diagram, an eye diagram is formed by the persistence effect of the oscilloscope, which overlaps the waveform of each scanned symbol, resulting in an eye pattern. The eye diagram is also a graphical representation observed on an oscilloscope when adjusting the performance of a transmission system.

7. Eye width, eye width reflects the total jitter of the signal, which is the width of the eye diagram along the horizontal axis. It is the time difference between the crossing points of the upper and lower edges. The time between the crossing points is calculated based on the average of the histograms at two zero-crossing points in the signal, and the standard deviation of each distribution is obtained by subtracting the difference between the two averages.

In the existing CDR structure, the phase detector obtains lagging or leading information based on the equalized input signal and clock phase. The method used by existing phase detectors involves directly sampling the input signal to obtain direct sampling data information. Then, the input signal is compared with reference levels (including high and low levels) to obtain the first sampling output error information and the second sampling output error information. Based on the direct sampling data information, the first sampling output error information, the second sampling output error information, and the pre-defined calculation method for leading or lagging, the leading or lagging information of the input signal is calculated. However, upon observation, it has been found that the phase detection method used by the phase detectors in traditional techniques does not output accurate leading or lagging information, which leads to the final sampling of the input signal being leading or lagging in phase. Therefore, this application provides a phase detection method and apparatus to address the issue of phase advancement or delay during sampling input signals in traditional CDR.

In an embodiment, as shown in FIG. 1, a phase detection method is provided, comprising the following steps S101 to S105:

S101: Receiving the input pulse signal.

Furthermore, the input pulse signal is processed by a continuous-time linear equalizer to obtain a second input pulse signal, which replaces the original input pulse signal. The continuous-time linear equalizer is used to enhance the high-frequency components of the input pulse signal to compensate for high-frequency channel losses.

Furthermore, the second input pulse signal is processed by a decision feedback equalizer to obtain a third input pulse signal, which replaces the input pulse signal. The decision feedback equalizer is used to eliminate inter symbol interference (ISI) by processing the input pulse signal in the digital domain after the decision point.

S102, Obtaining the primary sampling point of the input pulse signal.

Typically, the primary sampling points are selected as the peak positions of the phase of the input pulse signal.

S103, Calculating the area formed by the waveform curve of the input pulse signal and the time axis within the preceding unit time of the primary sampling point.

Furthermore, the calculation of the area formed by the waveform curve of the input pulse signal and the time axis within the preceding unit time of the primary sampling point specifically comprises:

- receiving the input pulse signal through a first integration circuit;
- calculating the first area formed by the waveform curve of the input pulse signal and the time axis within the preceding unit time of the primary sampling point using the first integration circuit.

Figure 4:
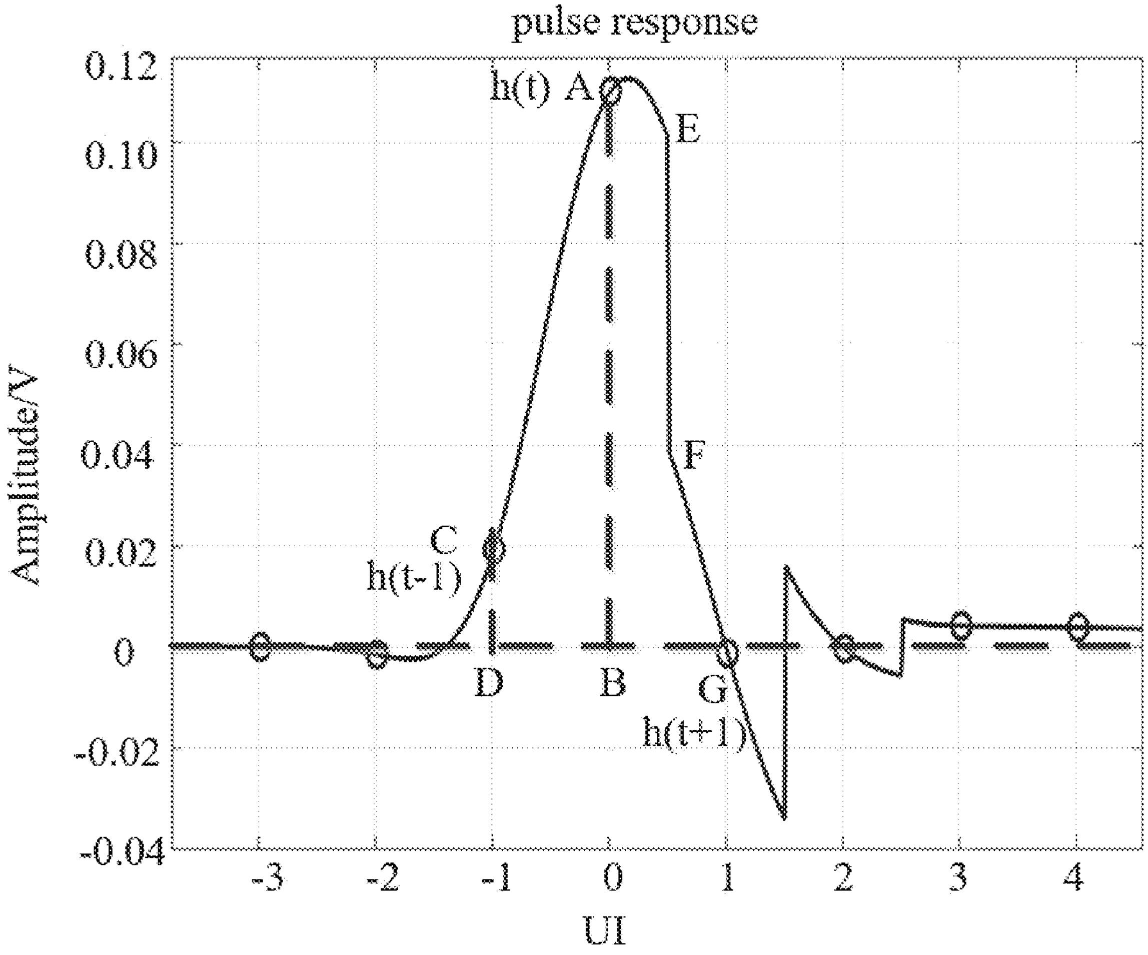
FIG. 4 shows another sampled phase curve of the input pulse signals in an embodiment of the present invention.

Specifically, as shown in FIG. 4, point A represents the specific primary sampling point in this embodiment, point C represents the first sampling point on the input pulse signal preceding the primary sampling point A, point B represents a point on the time axis corresponding to the primary sampling point A, and point D represents a point on the time axis corresponding to the first sampling point C. The straight line between the primary sampling point A and point B, the straight line between point B and point D, the straight line between point D and point C, and the curve between point C and the primary sampling point A together form a closed shape ABDC. The area of the closed shape ABDC is defined as the first area.

S104, Calculating the second area formed by the waveform curve of the input pulse signal and the time axis within the subsequent unit time of the primary sampling point.

Further, the calculation of the second area formed by the waveform curve of the input pulse signal and the time axis within the subsequent unit time of the primary sampling point specifically comprises:

- receiving the input pulse signal through a second integration circuit;
- calculating the second area formed by the waveform curve of the input pulse signal and the time axis within the subsequent unit time after the primary sampling point using the second integration circuit.

Specifically, as shown in FIG. 4, point G represents the second sampling point on the input pulse signal one unit time after the main sampling point A. Point E represents the third sampling point where the waveform curve of the input pulse signal exhibits significant changes within one unit time after the main sampling point A. Point F represents the fourth sampling point where the waveform curve of the input pulse signal exhibits significant changes within one unit time after the main sampling point A. The straight line between the main sampling point A and point B, the straight line between point B and point G, the curve between point G and point F, the curve between point F and point E, and the curve between point E and the main sampling point A collectively form a closed shape ABGFE. The area of the closed shape ABGFE represents the second area.

S105, Comparing the size of the first area and the size of the second area to obtain the first comparison result, and outputting the phase detection result of the input pulse signal based on the first comparison result and pre-set truth rules.

Furthermore, the comparison of the size of the first and the size of the second areas specifically comprises:

receiving the first calculation result of the first area and the second calculation result of the second area using a comparator;

comparing the size of the first area calculation result and the size of the second area calculation result using the comparator to obtain the first comparison result.

Specifically, the first integration circuit integrates the closed shape ABDC to obtain the first integration result, and the second integration circuit integrates the closed shape ABGFE to obtain the second integration result. The first integration result and the second integration result are then sent to the comparator, which compares them to obtain the first comparison result.

Furthermore, outputting the phase detection result of the input pulse signal based on the first comparison result and predefined truth rules includes:

Processing the input pulse signal through a data sampling circuit to obtain the first phase information.

Processing the first comparison result through an error sampling circuit to obtain the first error information.

Utilizing predefined truth rules of the phase detection circuit to calculate the phase detection result of the input pulse signal based on the first phase information and the first error information.

Specifically, the error sampling circuit receives the first comparison result and clock signals to be frequency-divided. After processing by the error sampling circuit, the first error information is output according to the rules shown in FIG. 7. In the figure, k represents the current time, e(k) represents the first error information at the current time, k+1 represents the next time unit after the current time, and k−1 represents the preceding time unit before the current time. According to the rules shown in FIG. 7, if the output of the first integration circuit is greater than or equal to the output of the second integration circuit, e(k) is set to 1; if the output of the first integration circuit is less than the output of the second integration circuit, e(k) is set to 0.

Furthermore, the first error information e(k) is sent to the phase detection circuit. The data sampling circuit processes the input pulse signal to obtain the first phase information b(k). Here, k represents the current time, b(k) represents the first phase information at the current time, k+1 represents the next time unit after the current time, and k−1 represents the preceding time unit before the current time. The first phase information is sent to the phase detection circuit. The phase detection circuit receives the first error information and the first phase information, and performs calculations to obtain the phase detection result of the input pulse signal according to the truth table shown in FIG. 8. The phase detection result includes the leading or lagging information of the phase of the input pulse signal.

As shown in FIG. 8, b(k) represents the first phase information at the current time, b(k+1) represents the first phase information at the next time unit after the current time, and b(k−1) represents the first phase information at the preceding time unit before the current time. e(k) represents the first error information at the current time, "early" represents the phase being leading of the input pulse signal, and "late" represents the phase being lagging of the input pulse signal. For example, taking the first row of FIG. 8 as an example, when b(k−1)=0, b(k)=1, b(k+1)=0, and e(k)=1, it indicates that the phase of the input pulse signal is leading.

Figure 3:
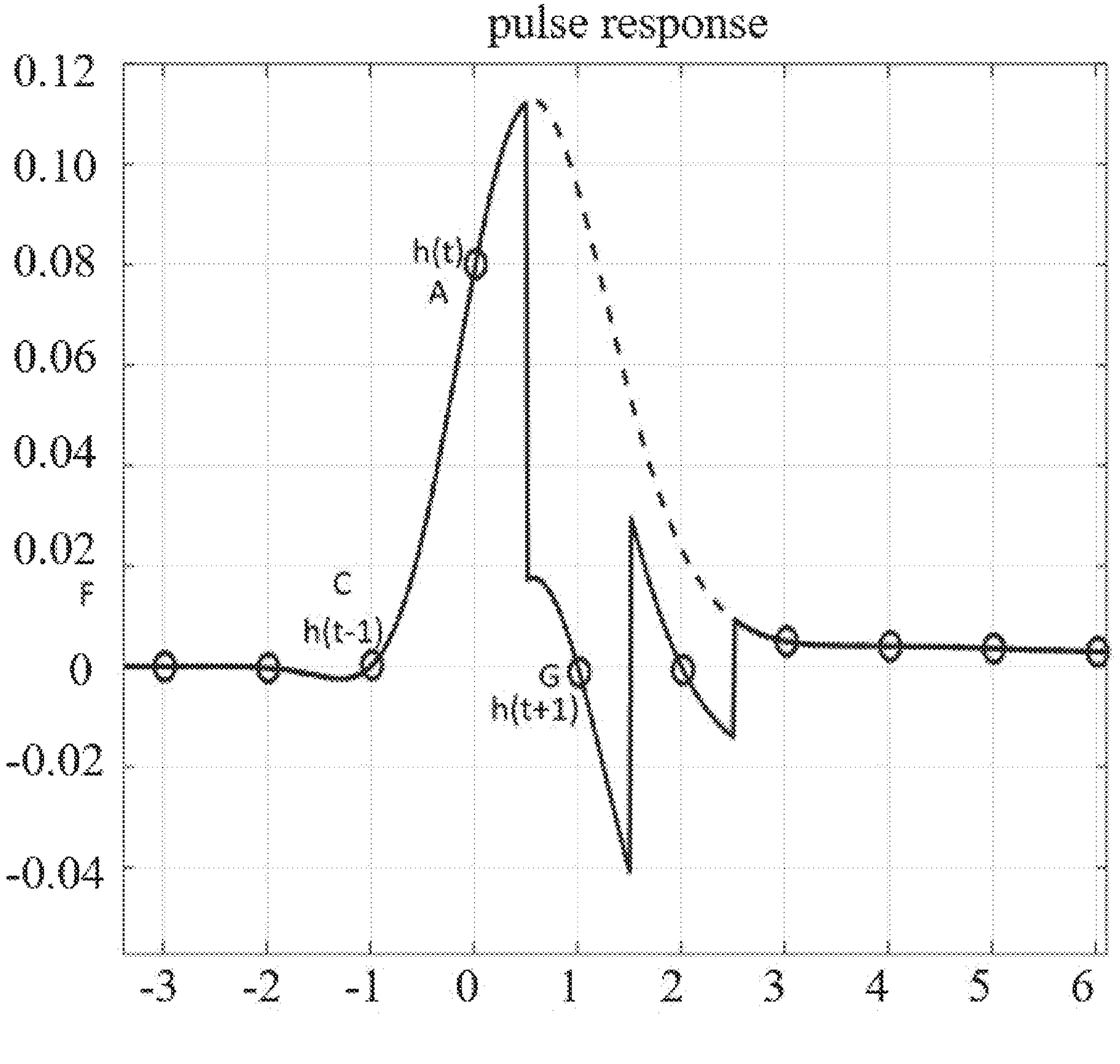
FIG. 3 shows a sampled phase curve of the input pulse signals in an embodiment of the present invention.
Figure 5:
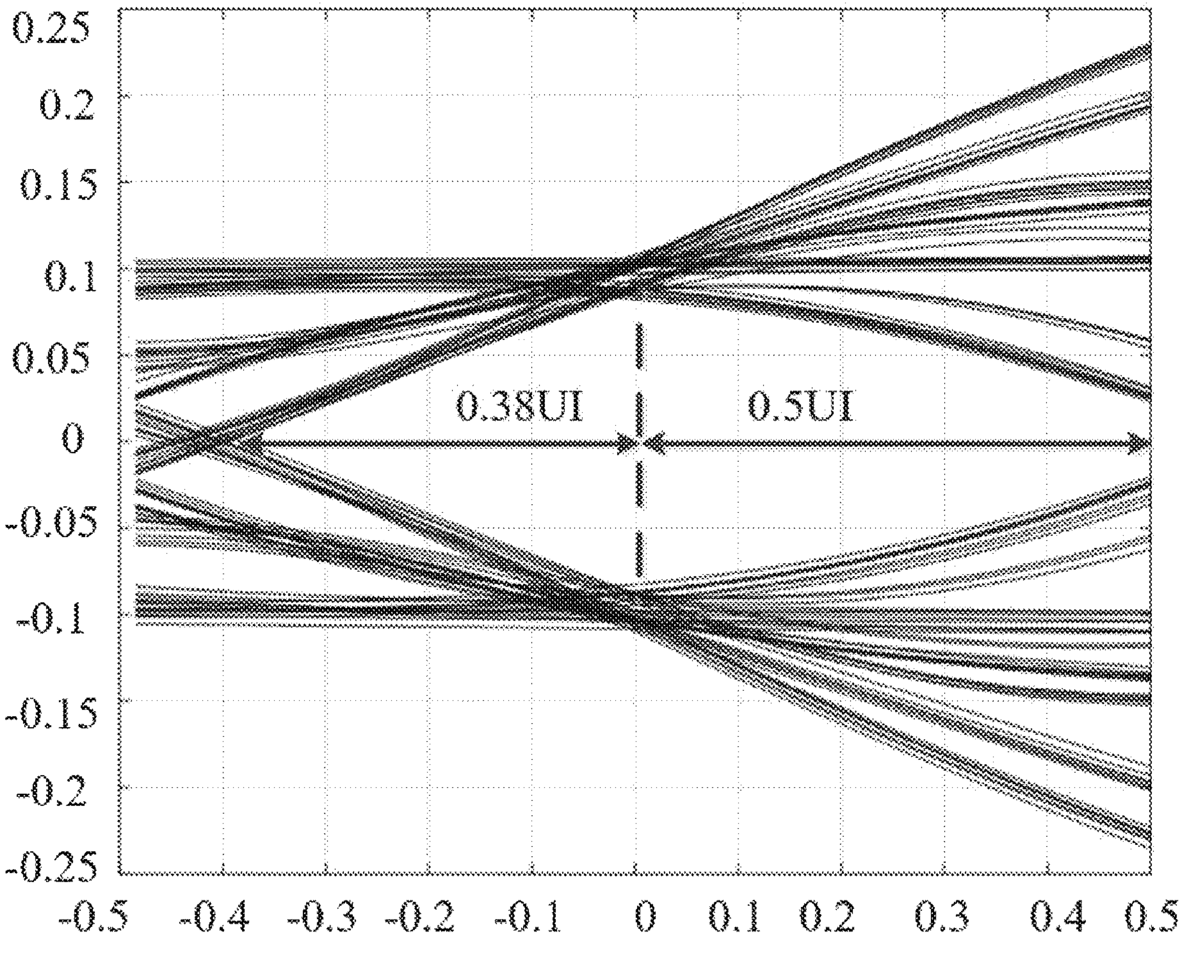
FIG. 5 shows a simulated eye diagram of the input pulse signals in an embodiment of the present invention.
Figures 6, 7:
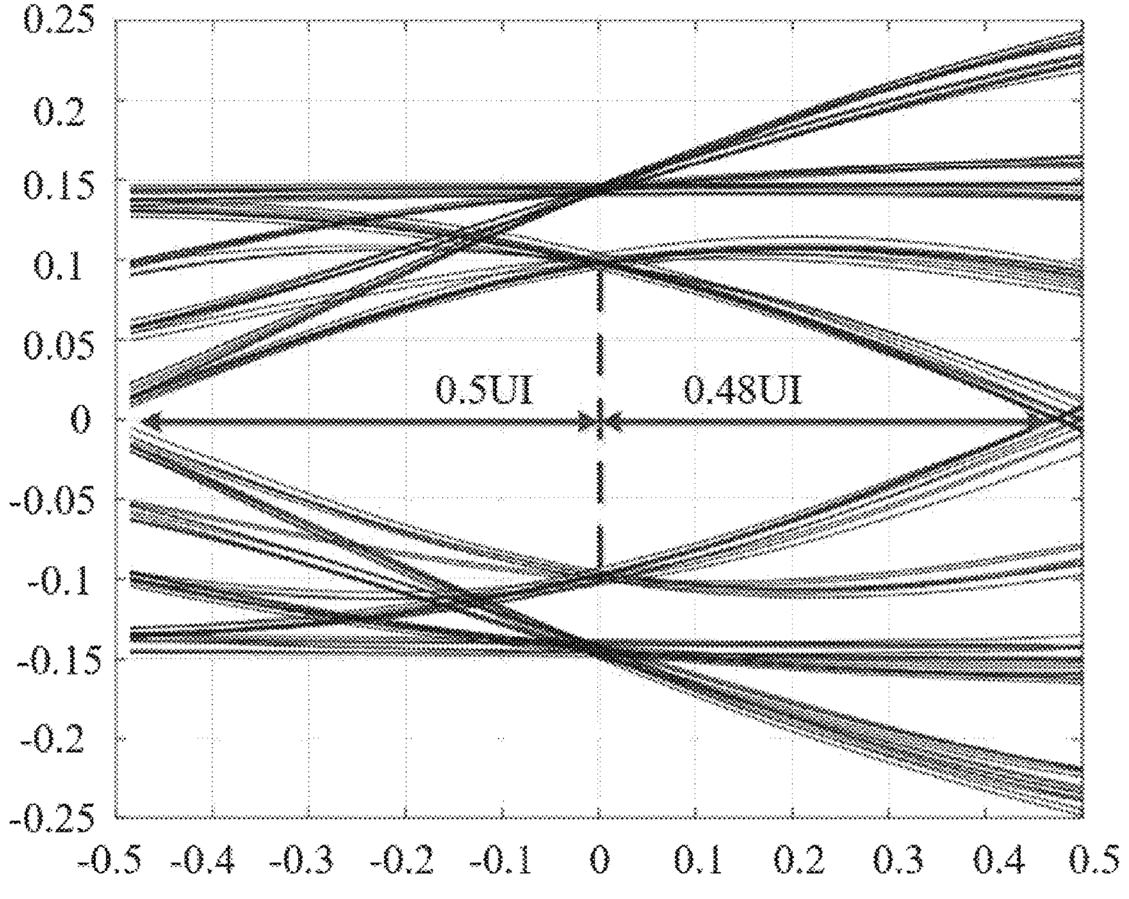
FIG. 6 shows another simulated eye diagram of the input pulse signals in an embodiment of the present invention.
FIG. 7 shows a table of the first error information judgment rules in an embodiment of the present invention.

In this embodiment, the curve of pulse response and sampling phase in the traditional solution is shown in FIG. 3, while the curve of pulse response and sampling phase in the proposed solution in this application is shown in FIG. 4. Here, h represents the curve of the sampling phase, t represents the time of the primary sampling point, h(t) represents the point on the curve of the sampling phase at the current time of the primary sampling point, h(t+1) represents the point on the curve of the sampling phase at the next time unit after the current time of the primary sampling point, and h(t−1) represents the point on the curve of the sampling phase at the preceding time unit before the current time of the primary sampling point. By comparison, it is found that in the proposed solution causes h(t) to shift to the right. The optimal sampling phase of the CDR should make the eye diagram symmetrical, with consistent eye width on both sides. If the eye on the left side of the sampling point is smaller, it indicates that the sampling is early; if the eye on the right side of the sampling point is smaller, it indicates that the sampling is late. Simulations were conducted separately for both the traditional solution and the proposed solution in this application based on the input pulse signal, resulting in the eye diagrams shown in FIGS. 5 and 6. FIG. 5 shows the simulated eye diagram of the traditional solution, and FIG. 6 shows the simulated eye diagram of the proposed solution. By comparison, it can be observed that the eye diagram in FIG. 5 is asymmetrical, with the left eye being smaller, indicating that the sampling in the traditional solution is early. In contrast, the eye diagram in FIG. 6 is almost symmetrical. Compared to the traditional solution, the CDR sampling point is almost in the center of the eye diagram. The left eye width in the proposed solution is 0.1 units larger than that in the traditional scheme. This indicates that the proposed solution solves the problem of significant early sampling and asymmetrical eye diagrams in traditional technology.

Figure 2:
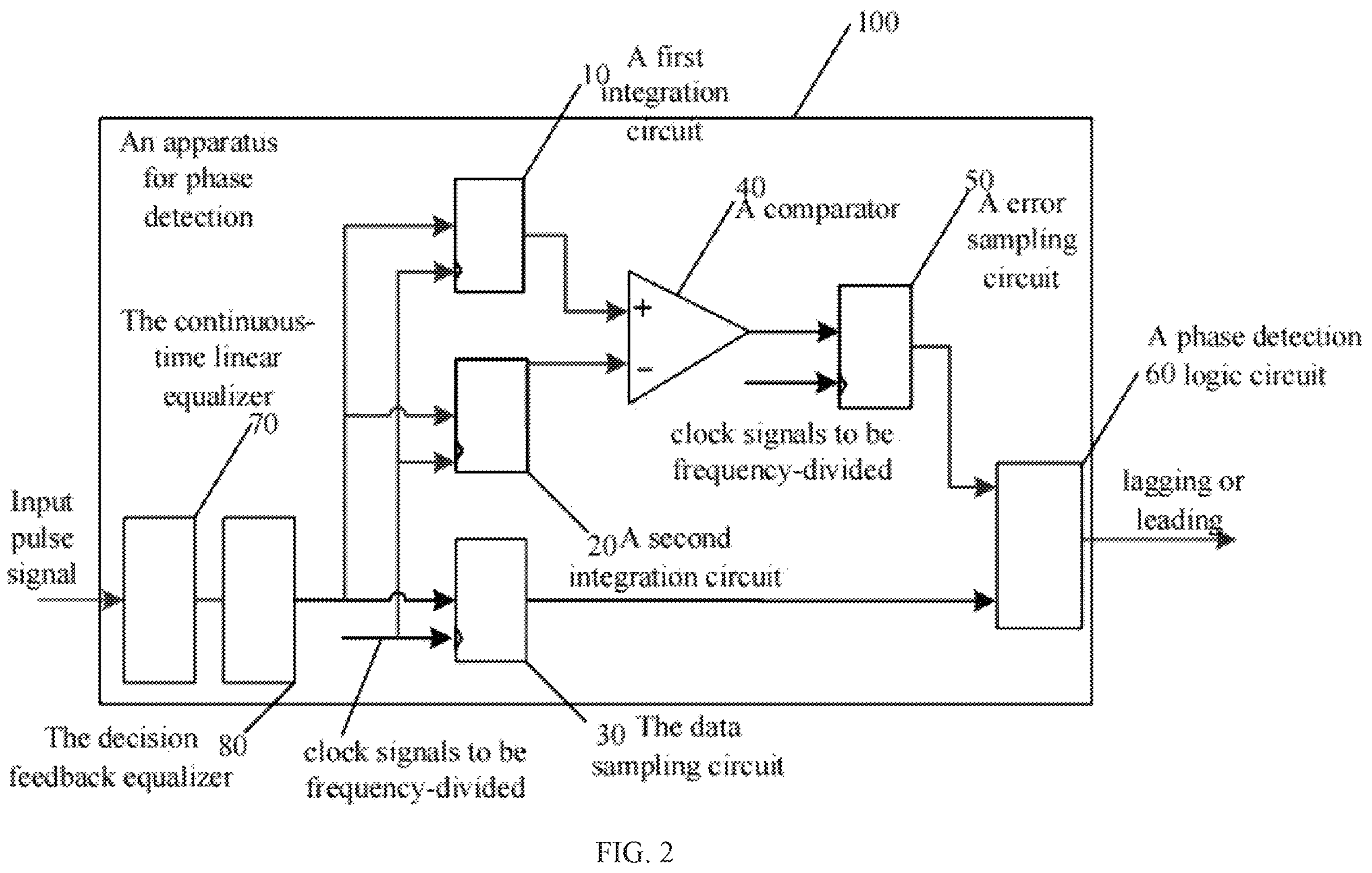
FIG. 2 shows a structural diagram of the phase detection apparatus in an embodiment of the present invention.

In an example, a phase detection apparatus 100 is provided, which corresponds to the phase detection method described in the above embodiment. As shown in FIG. 2, the phase detection apparatus 100 includes a first integration circuit 10, a second integration circuit 20, a data sampling circuit 30, a comparator 40, an error sampling circuit 50, a phase detection logic circuit 60, a continuous-time linear equalizer 70, and a decision feedback equalizer 80. The detailed description of each functional module is as follows:

A first integration circuit 10, which is configured for receiving the input pulse signals, calculating the first area formed by the waveform curve of the input pulse signals and the time axis within the preceding unit time of the primary sampling point, and sending the first area to a comparator.

A second integration circuit 20, which is configured for receiving the input pulse signals, calculating the second area formed by the waveform curve of the input pulse signals and the time axis within the subsequent unit time of the primary sampling point, and sending the second area to the comparator.

The data sampling circuit 30, which is configured for receiving the input pulse signals, processing the input pulse signals to obtain first phase information, and sending the first phase information to the phase detection logic circuit.

The comparator 40, which is configured for receiving the first area and the second area, comparing the size of the first area and the size of the second area to obtain a first comparison result, and sending the first comparison result to an error sampling circuit.

The error sampling circuit 50, which is configured for receiving the first comparison result, processing the first comparison result to obtain the first error information, and sending the first error information to a phase detection logic circuit.

The phase detection logic circuit 60, which is configured for receiving the first error information and the first phase information, performing calculations based on a pre-defined true value rule to obtain the phase detection result of the input pulse signals.

A continuous-time linear equalizer 70, which is configured for receiving the input pulse signals, processing the input pulse signals to obtain a second input pulse signals, replacing the input pulse signals with the second input pulse signals, and send the second input pulse signals to the first integration circuit, the second integration circuit, and the data sampling circuit.

A decision feedback equalizer 80, which is configured for receiving the second input pulse signals, processing the second input pulse signals to obtain a third input pulse signals, replacing the input pulse signals with the third input pulse signals, and sending the third input pulse signals to the first integration circuit, the second integration circuit, and the data sampling circuit.

The specific definitions of the phase detection apparatus can be referenced from the definitions of the phase detection method mentioned above and will not be reiterated here. Each module in the aforementioned phase detection apparatus can be implemented entirely or partially through software, hardware, or a combination of both. These modules can be embedded in or independent of the processor within the computer equipment in hardware form or stored in the memory of the computer equipment in software form, allowing the processor to execute the operations corresponding to each module.

In one embodiment, a computer-readable storage medium is provided, on which a computer program is stored. When executed by a processor, the computer program implements the steps of the phase detection method as described in the above embodiments, such as steps S101 to S105 shown in FIG. 1, as well as other extensions and related steps of the method.

It will be understood by those skilled in the art that all or part of the processes in the above examples can be implemented by instructing relevant hardware through a computer program. The computer program can be stored in a non-volatile computer-readable storage medium and, when executed, can include the process flows of the method embodiments described above. Any reference to memory, storage, databases, or other media in the embodiments provided by this application may include both non-volatile and/or volatile memory. Non-volatile memory may include Read-Only Memory (ROM), Programmable ROM (PROM), Electrically Programmable ROM (EPROM), Electrically Erasable Programmable ROM (EEPROM), or flash memory. Volatile memory may include Random Access Memory (RAM) or external high-speed cache memory. By way of illustration and not limitation, RAM is available in various forms, such as Static RAM (SRAM), Dynamic RAM (DRAM), Synchronous DRAM (SDRAM), Double Data Rate SDRAM (DDR SDRAM), Enhanced SDRAM (ESDRAM), Synchlink DRAM (SLDRAM), Direct Rambus RAM (RDRAM), Direct Rambus Dynamic RAM (DRDRAM), and Rambus Dynamic RAM (RDRAM), etc.

Those skilled in the art will clearly understand that, for convenience and brevity of description, the division of the functional units and modules above is merely exemplary. In practical applications, the described functions can be distributed among different functional units or modules as needed. This means that the internal structure of the device can be divided into different functional units or modules to complete all or part of the functions described above.

The above-described embodiments are merely embodiments of the present disclosure. For those skilled in the art, improvements can be made without departing from the concept of the present disclosure, but these improvements all belong to the protection scope of the present disclosure.

What is claimed is:

1. A method for phase detection comprising:
- receiving an input pulse signal;
- obtaining a primary sampling point of the input pulse signal;
- calculating a first area formed by the waveform curve of the input pulse signal and the time axis within a preceding unit time of the primary sampling point;
- calculating a second area formed by the waveform curve of the input pulse signal and the time axis within a subsequent unit time of the primary sampling point;
- comparing the size of the first area with the size of the second area to obtain a first comparison result;
- outputting a phase detection result of the input pulse signal based on the first comparison result and a pre-defined true value rule.

2. The method as claimed in claim 1, after receiving the input pulse signal, further comprising:
- processing the input pulse signal through a continuous-time linear equalizer to obtain a second input pulse signal, and replacing the input pulse signal with the second input pulse signal.

3. The method as claimed in claim 1, after receiving the input pulse signal, further comprising:
- processing the input pulse signal through a continuous-time linear equalizer to obtain a second input pulse signal;
- processing the second input pulse signal through a decision feedback equalizer to obtain a third input pulse signal, and replacing the input pulse signal with the third input pulse signal.

4. The method as claimed in claim 1, wherein calculating the first area formed by the waveform curve of the input pulse signal and the time axis within the preceding unit time of the primary sampling point, further comprising:
- receiving the input pulse signal using a first integration circuit;
- calculating the first area formed by the waveform curve of the input pulse signal and the time axis within the preceding unit time of the primary sampling point using the first integration circuit.

5. The method as claimed in claim 4, wherein calculating the second area formed by the waveform curve of the input pulse signal and the time axis within the subsequent unit time of the primary sampling point, further comprising:

receiving the input pulse signal using a second integration circuit;

calculating the second area formed by the waveform curve of the input pulse signal and the time axis within the subsequent unit time of the primary sampling point using the second integration circuit.

6. The method as claimed in claim 5, wherein comparing the size of the first area with the size of the second area to obtain the first comparison result, further comprising:

receiving the calculated first area and second area using a comparator;

comparing the size of the first area and the size of the second area using the comparator to obtain the first comparison result.

7. The method as claimed in claim 6, wherein outputting the phase detection result of the input pulse signal based on the first comparison result and the pre-defined true value rule further comprising:

processing the input pulse signal using a data sampling circuit to obtain the first phase information;

processing the first comparison result using an error sampling circuit to obtain the first error information;

calculating the first phase information and the first error information using the pre-defined true value rule in the phase detection circuit to obtain the phase detection result of the input pulse signal.

8. An apparatus for phase detection comprising:

a first integration circuit, which is configured for receiving an input pulse signal, calculating a first area formed by the waveform curve of the input pulse signal and the time axis within a preceding unit time of a primary sampling point, and sending the first area to a comparator;

a second integration circuit, which is configured for receiving the input pulse signal, calculating a second area formed by the waveform curve of the input pulse signal and the time axis within a subsequent unit time of the primary sampling point, and sending the second area to the comparator;

the comparator, which is configured for receiving the first area and the second area, comparing the size of the first area and the size of the second area to obtain a first comparison result, and sending the first comparison result to an error sampling circuit;

the error sampling circuit, which is configured for receiving the first comparison result, processing the first comparison result to obtain the first error information, and sending the first error information to a phase detection logic circuit;

a data sampling circuit, which is configured for receiving the input pulse signal, processing the input pulse signal to obtain first phase information, and sending the first phase information to the phase detection logic circuit;

a phase detection logic circuit, which is configured for receiving the first error information and the first phase information, performing calculations based on a pre-defined true value rule to obtain the phase detection result of the input pulse signal.

9. The apparatus as claimed in claim 8, further comprising:

a continuous-time linear equalizer, which is configured for receiving the input pulse signal, processing the input pulse signal to obtain a second input pulse signal, replacing the input pulse signal with the second input pulse signal, and sending the second input pulse signal to the first integration circuit, the second integration circuit, and the data sampling circuit.

10. The apparatus as claimed in claim 8, further comprising:

a continuous-time linear equalizer, which is configured for receiving the input pulse signal, processing the input pulse signal to obtain a second input pulse signal;

a decision feedback equalizer, which is configured for receiving the second input pulse signal, processing the second input pulse signal to obtain a third input pulse signal, replacing the input pulse signal with the third input pulse signal, and sending the third input pulse signal to the first integration circuit, the second integration circuit, and the data sampling circuit.

* * * * *